(12) United States Patent
Noshiro

(10) Patent No.: US 9,218,869 B2
(45) Date of Patent: Dec. 22, 2015

(54) MEMORY DEVICE

(71) Applicant: FUJITSU LIMITED, Kawasaki-shi, Kanagawa (JP)

(72) Inventor: Hideyuki Noshiro, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/259,566

(22) Filed: Apr. 23, 2014

(65) Prior Publication Data

US 2014/0340960 A1    Nov. 20, 2014

(30) Foreign Application Priority Data

May 20, 2013   (JP) ................. 2013-106495

(51) Int. Cl.
*G11C 11/16*   (2006.01)
*G11C 11/15*   (2006.01)
*G11C 11/56*   (2006.01)

(52) U.S. Cl.
CPC ............ *G11C 11/1675* (2013.01); *G11C 11/15* (2013.01); *G11C 11/5607* (2013.01)

(58) Field of Classification Search
CPC ................................ G11C 11/16; G11C 11/15
USPC .................................................. 365/158, 173
See application file for complete search history.

(56) References Cited

U.S. PATENT DOCUMENTS

2006/0209593 A1   9/2006   Toda
2013/0016554 A1*  1/2013   Abedifard ..................... 365/158

FOREIGN PATENT DOCUMENTS

JP    2006-260711 A1   9/2006
JP    2006260711 A  *  9/2006

OTHER PUBLICATIONS

"A Multi-Level-Cell Spin-Transfer Torque Memory wth Series-Stacked Magnetotunnel Juntions" T. Ishigaki , 2010.*
Ishigaki T. "A multi-level-cell spin-transfer torque memory with series-stacked magnetotunnel junctions", Jun. 2010. IEEE, pp. 47-48.*
T. Ishigaki, et al. "A Multi-Level-Cell Spin-Transfer Torque Memory with Series-Stacked Magenotunnel Junctions;" 2010 Symposium on VLSI Technology Digest of Technical Papers; 2010; pp. 47-48 (2 Sheets)/p. 2 of specification.

* cited by examiner

*Primary Examiner* — Amir Zarabian
*Assistant Examiner* — Muna A Techane
(74) *Attorney, Agent, or Firm* — Kratz, Quintos & Hanson, LLP

(57) ABSTRACT

A memory device includes: a memory element which includes three or more resistance states by using plural magneto-resistive elements each having a first resistance state or a second resistance state; and a comparison and determination circuit which compares the resistance states of the memory element before and after one first magneto-resistive element from among the plural magneto-resistive elements in the memory element is rewritten into the first resistance state, and determines the resistance state of the memory element in accordance with the comparison result.

5 Claims, 7 Drawing Sheets

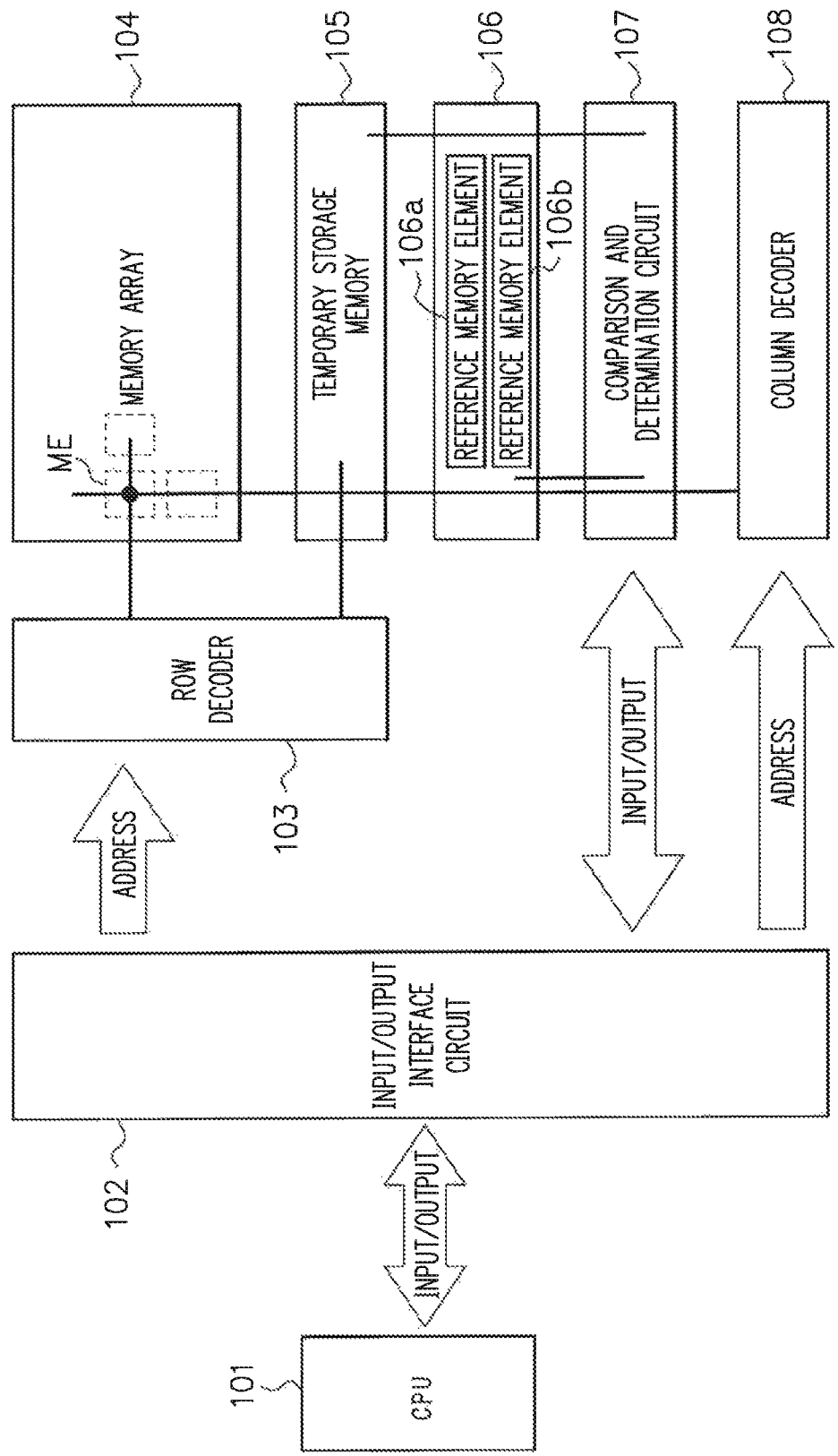

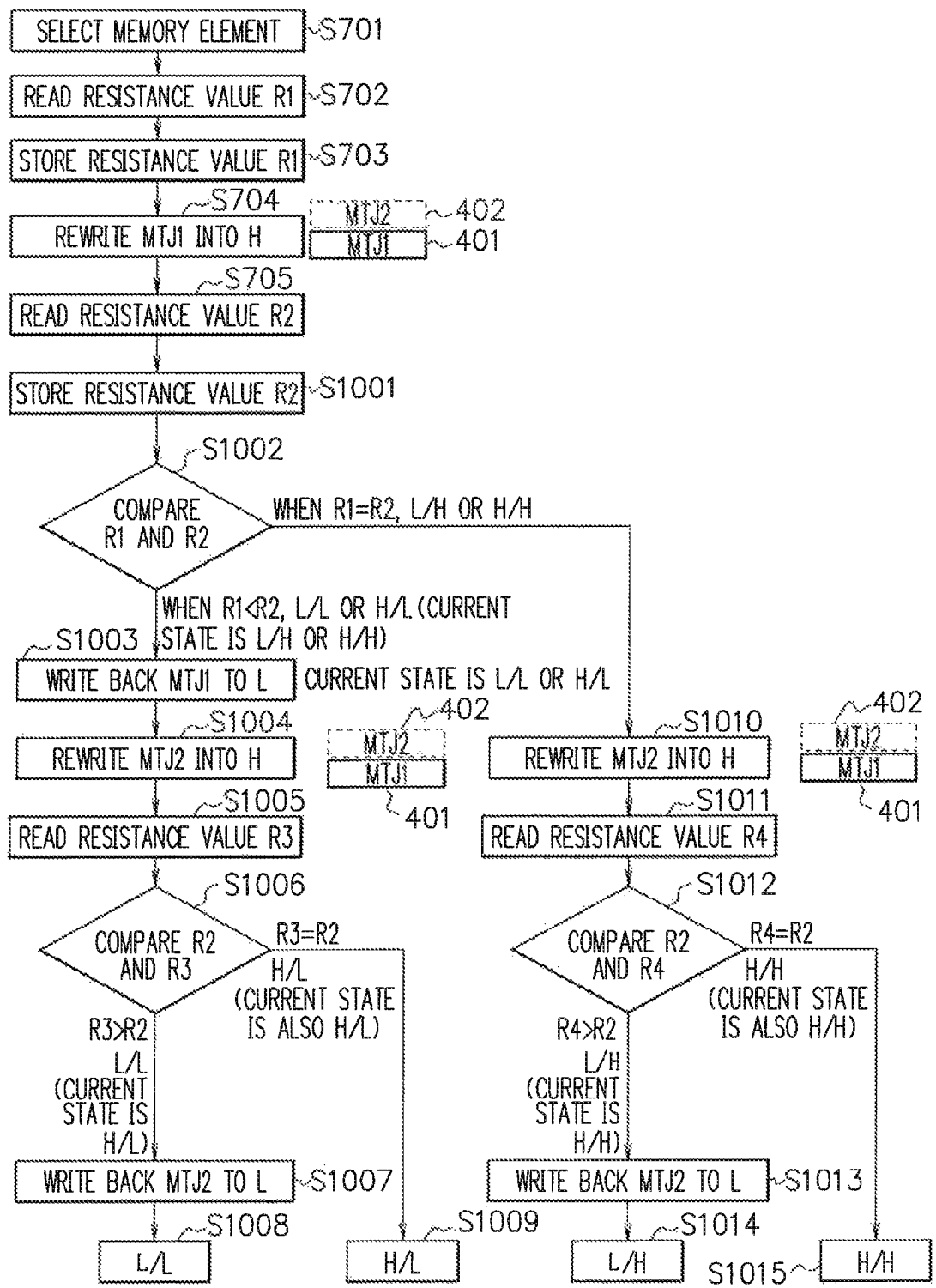
F I G. 10

MEMORY DEVICE

CROSS-REFERENCE TO RELATED APPLICATION

This application is based upon and claims the benefit of priority of the prior Japanese Patent Application No. 2013-106495, filed on May 20, 2013, the entire contents of which are incorporated herein by reference.

FIELD

The embodiments discussed herein are directed to a memory device.

BACKGROUND

A semiconductor memory device including a memory cell array in which memory cells capable of setting plural physical quantity levels are arranged, and simultaneously selected two memory cells make up a pair cell to be a unit of date storage is known (for example, refer to Patent Document 1). In the semiconductor memory device, one of "N" (N is an integer of 3 or more) pieces of physical quantity levels is set at each memory cell, and in each pair cell, the physical quantity levels of the two memory cells making up the pair cell are different, and each pair cell stores an M-value data (where M>N) represented by $M=2^n$ (where "n" is an integer of 2 or more) which is defined by a combination state in which differences between the physical quantity levels are different.

Besides, a memory of a multi-level cell using plural magneto-tunnel junctions is known (for example, refer to Non-Patent Document 1).

[Patent Document 1] Japanese Laid-open Patent Publication No. 2006-260711

[Non-Patent Document 1] T. Ishigaki et al., "A Multi-Level-Cell Spin-Transfer Torque Memory with Series-Stacked Magnetotunnel Junctions", 2010 Symposium on VLSI Technology Digest of Technical Papers, 2010, PP. 47-48

In the memory of the multi-level cell using the plural magneto-tunnel junctions, determination of the multi-level becomes difficult when variation of resistance values of the multi-level cell becomes large.

SUMMARY

A memory device includes: a memory element which includes three or more resistance states by using plural magneto-resistive elements each having a first resistance state or a second resistance state; and a comparison and determination circuit which compares the resistance states of the memory element before and after one first magneto-resistive element from among the plural magneto-resistive elements in the memory element is rewritten into the first resistance state, and determines the resistance state of the memory element in accordance with the comparison result.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 is a view illustrating a configuration example of a memory device according to a first embodiment;

FIG. 10 is a flowchart illustrating a read process example of the memory device according to the second embodiment.

DESCRIPTION OF EMBODIMENTS

First Embodiment

Figures 2A, 2B:
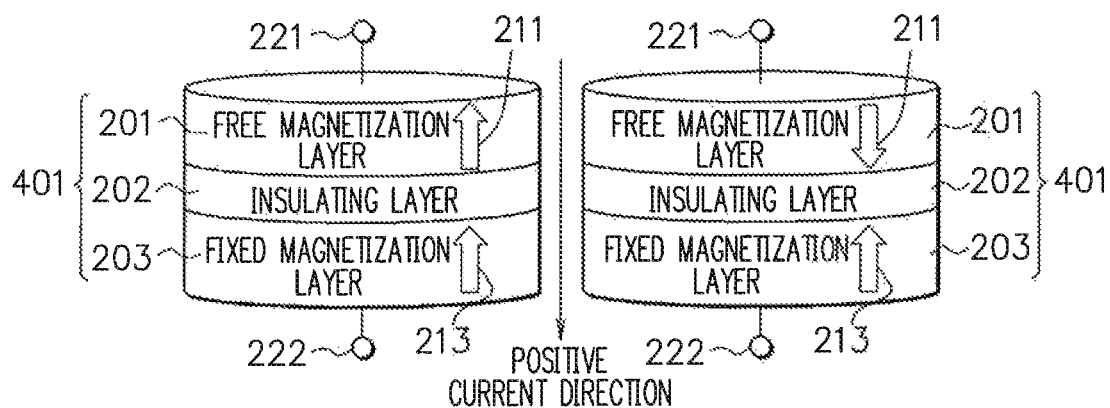
FIG. 2A is a view illustrating a configuration example of a magneto-resistive element in a low-resistance state.
FIG. 2B is a view illustrating a configuration example of the magneto-resistive element in a high-resistance state.

FIG. 1 is a view illustrating a configuration example of a memory device according to a first embodiment. The memory device is a multi-level magneto-resistive memory (MRAM: magnetoresistive random access memory). The memory device includes a central processing unit (CPU) 101, an input/output interface circuit 102, a row decoder 103, a memory array 104, a temporary storage memory 105, a reference memory 106, a comparison and determination circuit 107, and a column decoder 108. The memory array 104 includes plural memory elements ME disposed in a two-dimensional matrix state. Similarly, the temporary storage memory 105 also includes the plural memory elements ME. The row decoder 103 inputs a row address from the central processing unit 101 via the input/output interface circuit 102, and selects one row decode line from among plural row decode lines. The column decoder 108 inputs a column address from the central processing unit 101 via the input/output interface circuit 102, and selects one column decode line from among plural column decode lines. The memory elements ME in the two-dimensional matrix state are selected by the selection of the row decode line of the row decoder 103 and the selection of the column decode line of the column decoder 108. Reading or writing is performed for the selected memory element ME.

The reference memory 106 includes a first reference memory element 106a and a second reference memory element 106b. The first reference memory element 106a stores a first resistance value ref1. The second reference memory element 106b stores a second resistance value ref2.

At first, the reading is described. The comparison and determination circuit 107 inputs a read instruction from the central processing unit 101 via the input/output interface circuit 102, reads a resistance state from a selected memory element ME, performs a data determination, and outputs the determined data to the central processing unit 101 via the input/output interface circuit 102.

Next, the writing is described. When a write instruction and a write data are input from the central processing unit 101 via the input/output interface circuit 102, the write data is written to the memory element ME selected by the row decoder 103 and the column decoder 108.

FIG. 2A is a view illustrating a configuration example of a magneto-resistive element 401 in a low-resistance state, and FIG. 2B is a view illustrating a configuration example of the magneto-resistive element 401 in a high-resistance state. The magneto-resistive element 401 is provided in the memory element ME in FIG. 1. The magneto-resistive element 401 has a structure in which a tunnel insulating layer 202 is sandwiched by a free magnetization layer 201 and a fixed magnetization layer 203. A magnetization direction 213 of the fixed magnetization layer 203 is fixed. In FIG. 2A, a magnetization direction 211 of the free magnetization layer 201 is the same as the magnetization direction 213 of the fixed magnetization layer 203, and a resistance between an upper electrode 221 and a lower electrode 222 of the magneto-resistive element 401 is low-resistance. In FIG. 2B, the magnetization direction 211 of the free magnetization layer 201 is in reverse to the magnetization direction 213 of the fixed magnetization layer 203, and the resistance between the upper electrode 221 and the lower electrode 222 of the magneto-resistive element 401 is high resistance.

Figure 3:
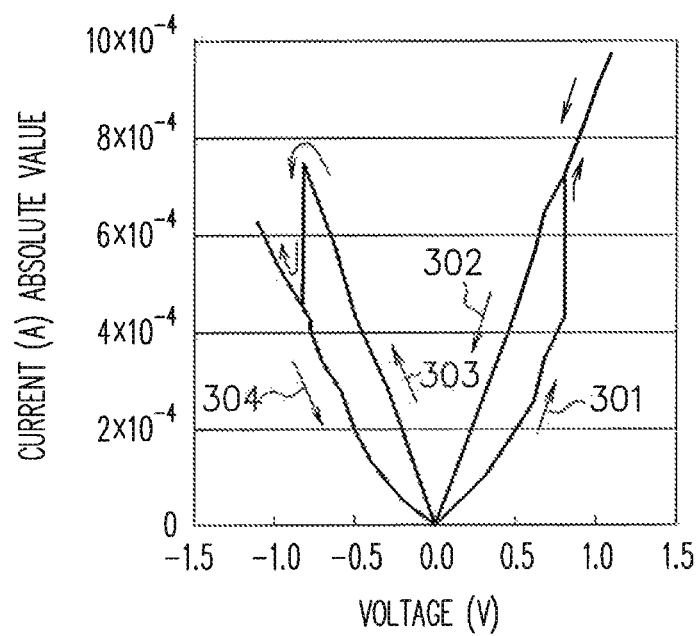
FIG. 3 is a graphic chart illustrating a relationship between a voltage and an absolute value of a current between an upper electrode and a lower electrode of the magneto-resistive element in FIGS. 2A and 2B.

FIG. 3 is a graphic chart illustrating a relationship between a voltage and an absolute value of a current between the upper electrode 221 and the lower electrode 222 of the magneto-resistive element 401 in FIGS. 2A and 2B. At first, the writing of the magneto-resistive element 401 is described. In the magneto-resistive element 401 in the high-resistance state in FIG. 2B, when a positive voltage (for example, +1.0 [V]) is applied between the upper electrode 221 and the lower electrode 222, a positive current flows via a path 301. After that, when "0" (zero) [V] is applied between the upper electrode 221 and the lower electrode 222, the current becomes "0" (zero) [A] via a path 302. The magneto-resistive element 401 is thereby rewritten into the low-resistance state in FIG. 2A from the high-resistance state in FIG. 2B. Note that in the magneto-resistive element 401 in the low-resistance state in FIG. 2A, when the positive voltage (for example, +1.0 [V]) is applied between the upper electrode 221 and the lower electrode 222, the magneto-resistive element 401 keeps the low-resistance state in FIG. 2A by passing through the path 302 in a reverse direction of an arrow of the path 302. Besides, when +0.5 V is applied under the high-resistance state, the current rises a path 301, then when the voltage is subsequently set to be "0" V, the current returns the path 301 as it is.

Besides, in the magneto-resistive element 401 in the low-resistance state in FIG. 2A, when a negative voltage (for example, −1.0 [V]) is applied between the upper electrode 221 and the lower electrode 222, a negative current flows via a path 303. After that, when "0" (zero) [V] is applied between the upper electrode 221 and the lower electrode 222, the current becomes "0" (zero) [A] via a path 304. The magneto-resistive element 401 is thereby rewritten into the high-resistance state in FIG. 2B from the low-resistance state in FIG. 2A. Note that in the magneto-resistive element 401 in the high-resistance state in FIG. 2B, when the negative voltage (for example, −1.0 [V]) is applied between the upper electrode 221 and the lower electrode 222, the magneto-resistive element 401 keeps the high-resistance state in FIG. 2B by passing through the path 304 in a reverse direction of an arrow of the path 304.

Next, the reading of the magneto-resistive element 401 is described. In the magneto-resistive element 401, a positive voltage (for example, +0.1 [V] to +0.2 [V]) is applied between the upper electrode 221 and the lower electrode 222. Under the low-resistance state in FIG. 2A, a comparatively large current flows via the path 302. Under the high-resistance state in FIG. 2B, a relatively small current flows via the path 301. Accordingly, when the current flowing between the upper electrode 221 and the lower electrode 222 is larger than a threshold value, it is determined that the magneto-resistive element 401 is in the low-resistance state in FIG. 2A, and when the current flowing between the upper electrode 221 and the lower electrode 222 is smaller than the threshold value, it is determined that the magneto-resistive element 401 is in the high-resistance state in FIG. 2B. The magneto-resistive element 401 is able to perform a nondestructive readout in which the resistance state does not change even if the reading is performed.

As stated above, the magneto-resistive element 401 is able to store two-values of the first resistance state and the second resistance state. A memory element ME to store the resistance states of three-values or more is described with reference to FIG. 4.

Figure 4:
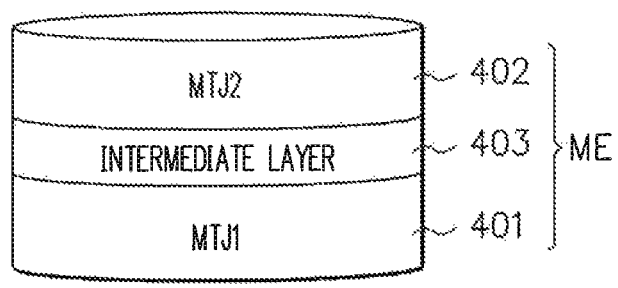
FIG. 4 is a view illustrating a configuration example of a memory element in FIG. 1.

FIG. 4 is a view illustrating a configuration example of the memory element ME in FIG. 1. The memory element ME has a structure in which an intermediate layer 403 is sandwiched by a first magneto-resistive element (MTJ1) 401 and a second magneto-resistive element (MTJ2) 402. The first magneto-resistive element 401 has a configuration illustrated in FIG. 2A or FIG. 2B. The second magneto-resistive element 402 has a similar configuration as the first magneto-resistive element 401. To enable four-values (=a case when N in N pieces of physical quantity level amount is four), it is necessary to make resistance values of the magneto-resistive element 401 and the magneto-resistive element 402 different. In case of the three-values, the resistance values of the magneto-resistive element 401 and the magneto-resistive element 402 may be the same resistance value. As a method to change the resistance value, it is the most effective to change thickness of a tunnel insulating film 202, and it is possible to secure a large resistance amplitude. In this case, the thickness of the tunnel insulating layer 202 (FIG. 2A or 2B) of the second magneto-resistive element 402 is different from the thickness of the tunnel insulating layer 202 of the first magneto-resistive element 401, and the resistance value of the second magneto-resistive element 402 is different from the resistance value of the first magneto-resistive element 401. Note that it is also possible to change the resistance values of the magneto-resistive element 402 and the magneto-resistive element 402 by changing thicknesses of the magnetic layers 201, 203. However, the resistance amplitude becomes small.

Figure 5:
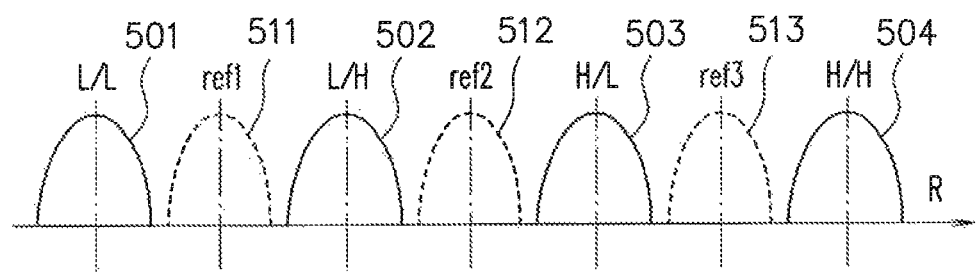
FIG. 5 is a view illustrating distributions of resistance values of four resistance states of the memory element.

FIG. 5 is a view illustrating distributions 501 to 504 of the resistance values of four resistance states of the memory element ME. A horizontal axis represents the resistance value, and a vertical axis represents a frequency. Here, "L" represents the low-resistance state, and "H" represents the high-resistance state. In the distribution 501, the first magneto-resistive element 401 is in the low-resistance state, the second magneto-resistive element 402 is in the low-resistance state, it is represented by "L", and is in a state in which the resistance value is the lowest. In the distribution 502, the first magneto-resistive element 401 is in the high-resistance state, the second magneto-resistive element 402 is in the low-resistance state, it is represented by "L/H", and is in a state in which the resistance value is the second lowest. In the distribution 503, the first magneto-resistive element 401 is in the low-resistance state, the second magneto-resistive element 402 is in the high-resistance state, it is represented by "H/L", and is in a state in which the resistance value is the third lowest. Here, the resistance value of the second magneto-resistive element 402 is different from the magneto-resistive element 401, and therefore, the resistance value of the memory element ME of the distribution 503 becomes higher than the resistance value of the memory element ME of the distribution 502. In the distribution 504, the first magneto-resistive element 401 is in the high-resistance state, the second magneto-resistive element 402 is in the high-resistance state, it is represented by "H/H", and is in a state in which the resistance value is the fourth lowest.

As stated above, it is possible to enable the memory element ME having the distributions 501 and 504 in four resistance states by a combination of the low-resistance state or the high-resistance state of the two pieces of magneto-resistive elements 401 and 402. Namely, it is possible to enable the four-valued MRAM.

Next, a method determining data of the distributions 501 to 504 of the four resistance states by using the three reference resistance values ref1 to ref3 is described. The reference resistance value ref1 is a resistance value of a first reference memory element having a similar configuration as the memory element ME, and has a distribution 511. The reference resistance value ref2 is a resistance value of a second reference memory element having the similar configuration as the memory element ME, and has a distribution 512. The reference resistance value ref3 is a resistance value of a third reference memory element having the similar configuration as the memory element ME, and has a distribution 513.

When the resistance value of the memory element ME is smaller than the reference resistance value ref1, it is possible to determine that the memory element ME is the data in the resistance state of "L/L" of the distribution 501. Besides, when the resistance value of the memory element ME is between the reference resistance values ref1 and ref2, it is possible to determine that the memory element ME is the data in the resistance state of "L/H" of the distribution 502. Besides, when the resistance value of the memory element ME is between the reference resistance values ref2 and ref3, it is possible to determine that the memory element ME is the data in the resistance state of "H/L" of the distribution 503. Besides, when the resistance value of the memory element ME is larger than the reference resistance value ref3, it is possible to determine that the memory element ME is the data in the resistance state of "H/H" of the distribution 504.

Here, the distributions 501 to 504 and 511 to 513 have variations of the resistance values resulting from manufacturing variance, and so on. If a part of the distribution of each of the distributions 501 to 504, 511 to 513 is overlapped with an adjacent distribution, it may cause a determination error. Accordingly, it is necessary to make an interval between each of the resistance values of the distributions 501 to 504, 511 to 513 wide to properly perform the data determination, and there is a problem in which design restriction is large. Besides, there is a problem in which a read margin is small.

Hereinafter, an embodiment capable of making the interval of each of the resistance values of the distributions 501 to 504 narrow, and properly performing the data determination of the resistance states of the memory element ME is described.

Figure 6:
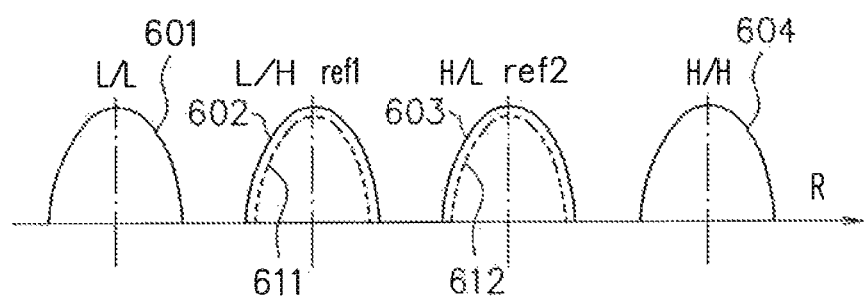
FIG. 6 is a view illustrating distributions of resistance values of four resistance states of the memory element according to the first embodiment.

FIG. 6 corresponds to FIG. 5, and is a view illustrating distributions 601 to 604 of resistance values of four resistance states of the memory element ME according to the embodiment. In the distribution 601, the first magneto-resistive element 401 is in the low-resistance state, the second magneto-resistive element 402 is in the low-resistance state, it is represented by "L/L", and is in a state in which the resistance value is the lowest. In the distribution 602, the first magneto-resistive element 401 is in the high-resistance state, the second magneto-resistive element 402 is in the low-resistance state, it is represented by "L/H", and is in a state in which the resistance value is the second lowest. In the distribution 603, the first magneto-resistive element 401 is in the low-resistance state, the second magneto-resistive element 402 is in the high-resistance state, it is represented by "H/L", and is in a state in which the resistance value is the third lowest. In the distribution 604, the first magneto-resistive element 401 is in the high-resistance state, the second magneto-resistive element 402 is in the high-resistance state, it is represented by "H/H", and is in a state in which the resistance value is the fourth lowest.

The first reference resistance value ref1 is a resistance value of the first reference memory element 106*a* having the similar configuration as memory element ME in the resistance state of "L/H", and has a distribution 611. The distribution 611 is a similar distribution as the distribution 602. The second reference resistance value ref2 is a resistance value of the second reference memory element 106*b* having the similar configuration as memory element ME in the resistance state of "H/L", and has a distribution 612. The distribution 612 is a similar distribution as the distribution 603.

The distribution 611 is the similar distribution as the distribution 602, and the distribution 612 is the similar distribution as the distribution 603, and therefore, it is possible to make each interval of the resistance values of the distributions 601 to 604 in four resistance states narrow compared to the case in FIG. 5. It is thereby possible to relax the design restriction, reduce the data determination error, and perform the proper data determination.

Figure 7:
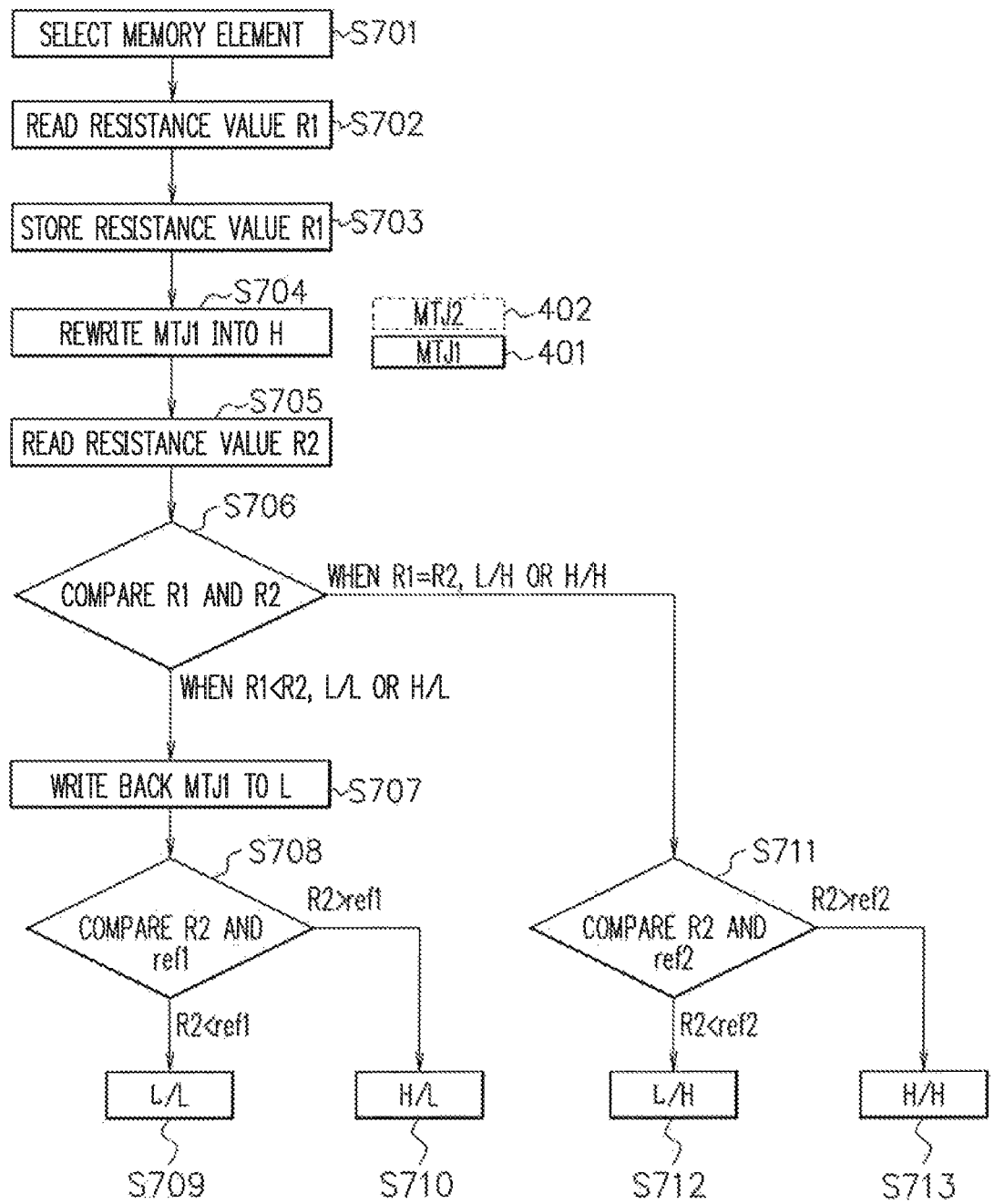
FIG. 7 is a flowchart illustrating a read process example of the memory device according to the first embodiment.

FIG. 7 is a flowchart illustrating a read process example of the memory device according to the present embodiment. At first, in step S701, the central processing unit 101 performs a selection of the memory element ME from which the reading is performed. Specifically, the central processing unit 101 outputs a row address to the row decoder 103 via the input/output interface circuit 102, and outputs a column address to the column decoder 108. The row decoder 103 selects one row decode line from among the plural row decode lines, and the column decoder 108 selects one column decode line from among the plural column decode lines. The memory element ME is thereby selected.

Next, in step S702, the central processing unit 101 reads a resistance value R1 of the selected memory element ME. Specifically, the central processing unit 101 outputs the read instruction to the comparison and determination circuit 107 via the input/output interface circuit 102. Then, the comparison and determination circuit 107 reads the resistance value (current value) R1 of the selected memory element ME.

Next, in step S703, the central processing unit 101 stores the resistance value R1 to the temporary storage memory 105. The temporary storage memory 105 is selected by the row decoder 103 and the column decoder 108.

Next, in step S704, the comparison and determination circuit 107 rewrites the first magneto-resistive element (MTJ1) 401 in the memory element ME selected in the step S701 into the high-resistance state.

Next, in step S705, the comparison and determination circuit 107 reads a resistance value R2 of the memory element ME after the rewrite.

Next, in step S706, the comparison and determination circuit 107 compares the resistance values R1 and R2. When the resistance values R1 and R2 are approximately the same, the first magneto-resistive element 401 in the memory element ME before the rewrite is in the high-resistance state, and the memory element ME before the rewrite is in the resistance state of "L/H" or "H/H", and therefore, a process goes to step S711. On the other hand, when the resistance value R1 is smaller than the resistance value R2, the first magneto-resistive element 401 in the memory element ME before the rewrite is in the low-resistance state, and the memory element ME before the rewrite is in the resistance state of "L/L" or "H/L", and therefore, the process goes to step S707. Specifically, when a value in which the resistance value R1 is subtracted from the resistance value R2 is larger than a threshold value, the process goes to the step S707, and the value in which the resistance value R1 is subtracted from the resistance value R2 is smaller than the threshold value, the process goes to the step S711.

In the step S707, the comparison and determination circuit 107 writes back the first magneto-resistance element 401 in the memory element ME after the rewrite to the low-resistance state because the first magneto-resistive element 401 before the rewrite is in the low-resistance state.

Next, in step S708, the comparison and determination circuit 107 reads the first reference resistance value ref1 from the first reference memory element 106a, and compares the resistance value R2 and the first reference resistance value ref1. When the resistance value R2 is smaller than the first reference resistance value ref1, the process goes to step S709. On the other hand, when the resistance value R2 is larger than the first reference resistance value ref1, the process goes to step S710.

In the step S709, the comparison and determination circuit 107 determines that the selected memory element ME is in the resistance state of "L/L", and outputs a data value corresponding to the resistance state of "L/L" to the central processing unit 101 via the input/output interface circuit 102.

In the step S710, the comparison and determination circuit 107 determines that the selected memory element ME is in the resistance state of "H/L", and outputs a data value corresponding to the resistance state of "H/L" to the central processing unit 101 via the input/output interface circuit 102.

In the step S711, the comparison and determination circuit 107 reads the second reference resistance value ref2 from the second reference memory element 106b, and compares the resistance value R2 and the second reference resistance value ref2. When the resistance value R2 is smaller than the second reference resistance value ref2, the process goes to step S712. On the other hand, when the resistance value R2 is larger than the second reference resistance value ref2, the process goes to step S713.

In the step S712, the comparison and determination circuit 107 determines that the selected memory element ME is in the resistance state of "H/L", and outputs a data value corresponding to the resistance state of "L/H" to the central processing unit 101 via the input/output interface circuit 102.

In the step S713, the comparison and determination circuit 107 determines that the selected memory element ME is in the resistance state of "H/H", and outputs a data value corresponding to the resistance state of "H/H" to the central processing unit 101 via the input/output interface circuit 102.

Note that in the step S704, the example in which the first magneto-resistive element 401 is rewritten into the high-resistance state is described, but the first magneto-resistive element 401 may be rewritten into the low-resistance state. In this case, it is possible to determine that the first magneto-resistive element 401 before the rewrite is in the low-resistance state if the resistance R1 and R2 are approximately the same in the step S706.

Besides, in the step S704, the example in which the first magneto-resistive element 401 is rewritten into the high-resistance state or the low-resistance state is described, but the second magneto-resistive element 402 may be rewritten into the high-resistance state or the low-resistance state. In this case, it is possible to determine that the second magneto-resistive element 402 before the rewrite is in the high-resistance state or the low-resistance state if the resistance R1 and R2 are approximately the same in the step S706.

As stated above, the memory element ME has three or more resistance states by using the plural magneto-resistive elements 401 and 402 each having the first resistance state or the second resistance state. The first reference memory element 106a has the first reference resistance value ref1 by using the plural magneto-resistive elements 401 and 402 each having the first resistance state or the second resistance state. The second reference memory element 106b has the second reference resistance value ref2 by using the plural magneto-resistive elements 401 and 402 each having the first resistance state or the second resistance state.

In the step S706, the comparison and determination circuit 107 compares the resistance states of the memory element ME before and after one first magneto-resistive element 401 from among the plural magneto-resistive elements 401 and 402 in the memory element ME is rewritten into the first resistance state, and determines the resistance state of the memory element ME in accordance with the comparison result.

In the step S708, the comparison and determination circuit 107 compares the resistance value R2 of the memory element ME after the rewrite and the first (reference) resistance value ref1 when the resistance states of the memory element ME before and after the rewrite are the different resistance states, and determines the resistance state of the memory element ME in accordance with the comparison result. Specifically, the comparison and determination circuit 107 performs the comparison by using the first (reference) resistance value ref1 of the first reference memory element 106a when the resistance states of the memory element ME before and after the rewrite are the different resistance states.

In the step S711, the comparison and determination circuit 107 compares the resistance value R2 of the memory element ME after the rewrite and the second (reference) resistance value ref2 when the resistance states of the memory element ME before and after the rewrite are the same resistance state, and determines the resistance state of the memory element ME in accordance with the comparison result. Specifically, the comparison and determination circuit 107 performs the comparison by using the second (reference) resistance value ref2 of the second reference memory element 106b when the resistance states of the memory element ME before and after the rewrite are the same resistance state.

According to the present embodiment, the data determination of the four resistance states is performed by using the first reference resistance value ref1 and the second reference resistance value ref2, and therefore, it is possible to make each interval of the resistance values of the four resistance states narrow. It is thereby possible to relax the design restriction, reduce the data determination error, and perform the proper data determination.

Second Embodiment

Figure 8:
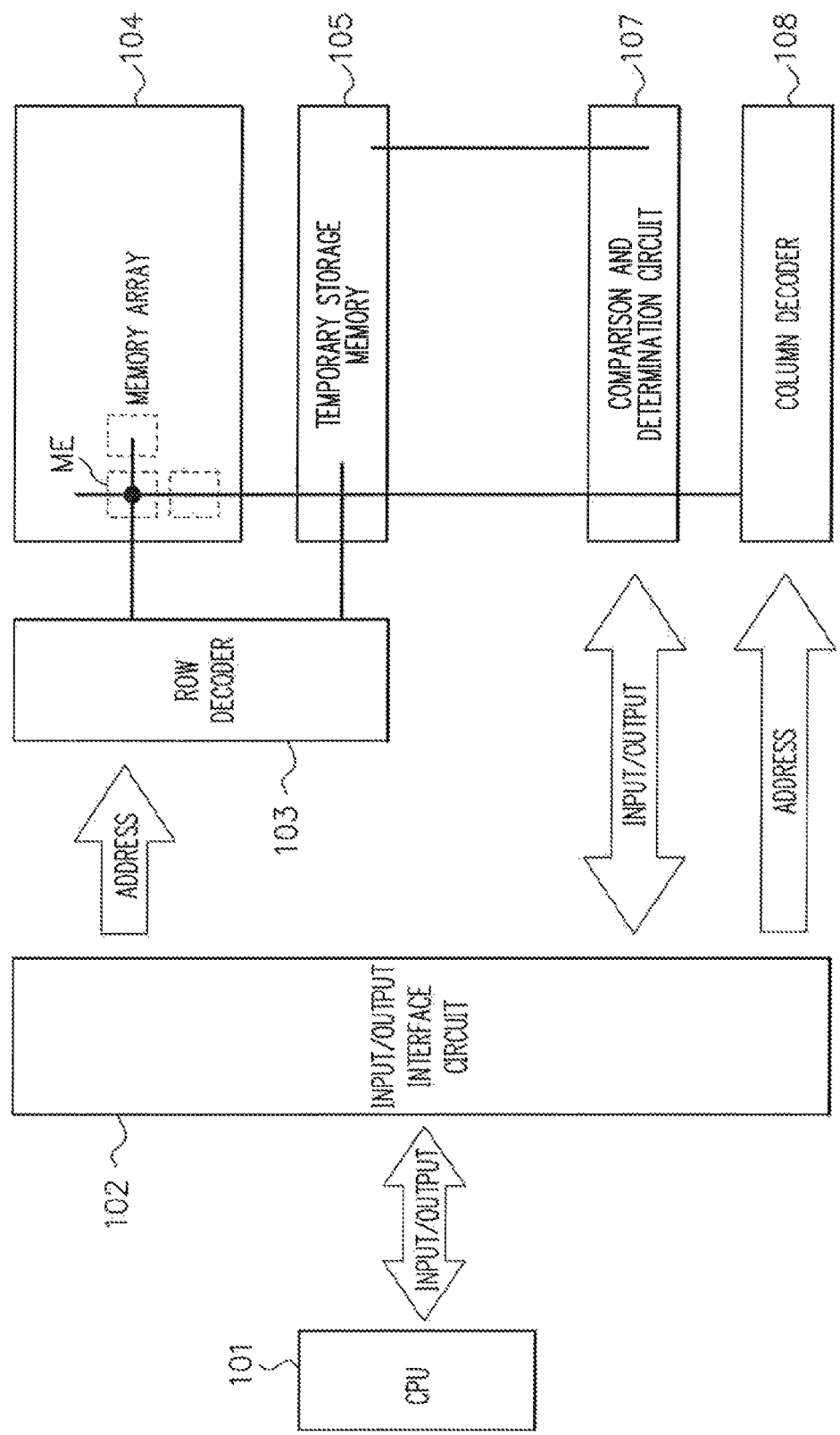
FIG. 8 is a view illustrating a configuration example of a memory device according to a second embodiment.

FIG. 8 is a view illustrating a configuration example of a memory device according to a second embodiment. The present embodiment (FIG. 8) is one in which the reference memory 106 is deleted from the first embodiment (FIG. 1). The comparison and determination circuit 107 of the present embodiment performs the data determination of the four resistance states without using the first reference resistance value ref1 and the second reference resistance value ref2. Hereinafter, points in which the present embodiment is different from the first embodiment are described.

Figure 9:
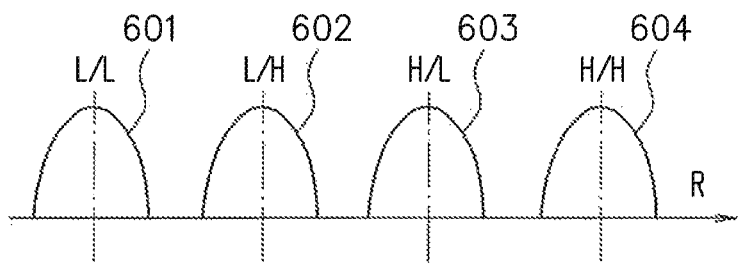
FIG. 9 is a view illustrating distributions of resistance values of four resistance states of a memory element according to the second embodiment.

FIG. 9 corresponds to FIG. 6, and is a view illustrating distributions 601 to 604 of resistance values of four resistance states of a memory element ME according to the present embodiment. The distributions 601 to 604 are the same as the distributions 601 to 604 in FIG. 6. The distribution 601 is the resistance state of "L/L", and is in a state in which the resistance value is the lowest. The distribution 602 is in the resistance state of "L/H", and is in a state in which the resistance value is the second lowest. The distribution 603 is in the resistance state of "H/L", and is in a state in which the resistance value is the third lowest. The distribution 604 is in the resistance state of "H/H", and is in a state in which the resistance value is the fourth lowest. As stated above, the comparison and determination circuit 107 performs the data determination of the four resistance states without using the first reference resistance value ref1 and the second reference resistance value ref2.

The present embodiment does not use the reference resistance values ref1 to ref3, and therefore, it is possible to make each interval of the resistance values of the distributions 601 to 604 of the four resistance states narrow compared to the case in FIG. 5 as same as the first embodiment. It is thereby possible to relax the design restriction, reduce the data determination error, and perform the proper data determination.

FIG. 10 is a flowchart illustrating a read process example of the memory device according to the present embodiment. At first, the memory device performs the processes of the steps S701 to S705. The processes of the steps S701 to S705 are the same as the processes of the steps S701 to S705 in FIG. 7.

Next, in step S1001, the central processing unit 101 stores the resistance value R2 read in the step S705 to the temporary storage memory 105. The temporary storage memory 105 is selected by the row decoder 103 and the column decoder 108.

Next, in step S1002, the comparison and determination circuit 107 compares the resistance values R1 and R2. When the resistance values R1 and R2 are approximately the same, the first magneto-resistive element 401 in the memory element ME before the rewrite is in the high-resistance state, and the memory element ME before the rewrite is in the resistance state of "L/H" or "H/H", and therefore, the process goes to step S1010. On the other hand, when the resistance value R1 is smaller than the resistance value R2, the first magneto-resistive element 401 in the memory element ME before the rewrite is in the low-resistance state, and the memory element ME before the rewrite is in the resistance state of "L/L" or "H/L", and therefore, the process goes to step S1003. In this case, the memory element ME after the rewrite is in the resistance state of "L/H" or "H/H". In this step, specifically, the process goes to the step S1003 when a value in which the resistance value R1 is subtracted from the resistance value R2 is larger than a threshold value, and goes to the step S1010 when the value in which the resistance value R1 is subtracted from the resistance value R2 is smaller than the threshold value.

In the step S1003, the comparison and determination circuit 107 writes back the first magneto-resistive element 401 in the memory element ME after the rewrite to the low-resistance state because the first magneto-resistive element 401 before the rewrite is in the low-resistance state. The memory element ME thereby returns to the initial resistance state of "L/L" or "H/L".

Next, in step S1004, the comparison and determination circuit 107 rewrites the second magneto-resistive element (MTJ2) 402 in the memory element ME into the high-resistance state.

Next, in step S1005, the comparison and determination circuit 107 reads a resistance value R3 of the memory element ME after the rewrite.

Next, in step S1006, the comparison and determination circuit 107 compares the resistance values R2 and R3. When the resistance values R2 and R3 are approximately the same, the second magneto-resistive element 402 in the initial memory element ME is in the high-resistance state, and the initial memory element ME is in the resistance state of "H/L", and therefore, the process goes to step S1009. Note that the current memory element ME is also in the resistance state of "H/L". On the other hand, when the resistance value R3 is larger than the resistance value R2, the second magneto-resistive element 402 in the initial memory element ME is in the low-resistance state, and the initial memory element ME is in the resistance state of "L/L", and therefore, the process goes to step S1007. Note that the current memory element ME is in the resistance state of "H/L". In this step, specifically, the process goes to the step S1007 when a value in which the resistance value R2 is subtracted from the resistance value R3 is larger than a threshold value, and the process goes to the step S1009 when the value in which the resistance value R2 is subtracted from the resistance value R3 is smaller than the threshold value.

In the step S1007, the comparison and determination circuit 107 writes back the second magneto-resistive element 402 in the memory element ME after the rewrite to the low-resistance state because the initial second magneto-resistive element 402 is in the low-resistance state. The memory element ME thereby returns to the initial resistance state of "L/L". After that, the process goes to step S1008.

In the step S1008, the comparison and determination circuit 107 determines that the selected memory element ME is in the resistance state of "L/L", and outputs a data value corresponding to the resistance state of "L/L" to the central processing unit 101 via the input/output interface circuit 102.

In the step S1009, the comparison and determination circuit 107 determines that the selected memory element ME is in the resistance state of "H/L", and outputs a data value corresponding to the resistance state of "H/L" to the central processing unit 101 via the input/output interface circuit 102.

In the step S1010, the comparison and determination circuit 107 rewrites the second magneto-resistive element (MTJ2) 402 in the memory element Me into the high-resistance state.

Next, in step S1011, the comparison and determination circuit 107 reads a resistance value R4 of the memory element ME after the rewrite.

Next, in step S1012, the comparison and determination circuit 107 compares the resistance values R2 and R4. When the resistance values R2 and R4 are approximately the same, the second magneto-resistive element 402 in the initial memory element ME is in the high-resistance state, and the initial memory element ME is in the resistance state of "H/H", and therefore, the process goes to step S1015. Note that the current memory element ME is also in the resistance state of "H/H". On the other hand, when the resistance value R4 is larger than the resistance value R2, the second magneto-resistive element 402 in the initial memory element ME is in the low-resistance state, and the initial memory element ME is in the resistance state of "L/H", and therefore, the process goes to step S1013. Note that the current memory element ME is in the resistance state of "H/H". In this step, specifically, the process goes to the step S1013 when a value in which the resistance value R2 is subtracted from the resistance value R4 is larger than a threshold value, and the process goes to the step S1015 when the value in which the resistance value R2 is subtracted from the resistance value R4 is smaller than the threshold value.

In the step S1013, the comparison and determination circuit 107 writes back the second magneto-resistive element 402 in the memory element ME after the rewrite to the low-resistance state because the initial second magneto-resistive element 402 is in the low-resistance state. The memory element ME thereby returns to the initial resistance state of "H/H". After that, the process goes to step S1014.

In the step S1014, the comparison and determination circuit 107 determines that the selected memory element ME is in the resistance state of "L/H", and outputs a data value corresponding to the resistance state of "L/H" to the central processing unit 101 via the input/output interface circuit 102.

In the step S1015, the comparison and determination circuit 107 determines that the selected memory element ME is in the resistance state of "H/H", and outputs a data value corresponding to the resistance state of "H/H" to the central processing unit 101 via the input/output interface circuit 102.

Note that in the steps S704, S1004 and S1010, the examples in which the magneto-resistive elements 401 and 402 are rewritten into the high-resistance state are described, but the magneto-resistive elements 401 and 402 may be rewritten into the low-resistance state as same as the above.

Besides, the examples are described in which the first magneto-resistive element 401 is rewritten in the step S704, and the second magneto-resistive element 402 is rewritten in the steps S1004 and S1010, but the second magneto-resistive element 402 may be rewritten in the step S704, and the first magneto-resistive element 401 may be rewritten in the steps S1004 and S1010.

As stated above, in the step S1002, the comparison and determination circuit 107 compares the resistance states of the memory element ME before and after one first magneto-resistive element 401 from among the plural magneto-resistive elements 401 and 402 in the memory element ME is rewritten into the first resistance state, and determines the resistance state of the memory element ME in accordance with the comparison result.

In the step S1006, the comparison and determination circuit 107 compares the resistance value R2 of the memory element ME after the rewrite and the first resistance value R3 when the resistance states of the memory element ME before and after the rewrite are the different resistance states, and determines the resistance state of the memory element ME in accordance with the comparison result. Specifically, when the resistance states of the memory element ME before and after the rewrite ere the different resistance states, the comparison and determination circuit 107 performs the comparison while setting the resistance state of the memory element ME after one second magneto-resistive element 402 which is different from the first magneto-resistive element 401 from among the plural magneto-resistive elements 401 and 402 in the memory element ME is rewritten into the first resistance state or the second resistance state as the first resistance value R3.

In the step S1012, the comparison and determination circuit 107 compares the resistance value R2 of the memory element ME after the rewrite and the second resistance value R4 when the resistance states of the memory element ME before and after the rewrite are the same resistance state, and determines the resistance state of the memory element ME in accordance with the comparison result. Specifically, when the resistance states of the memory element ME before and after the rewrite are the same resistance state, the comparison and determination circuit 107 performs the comparison while setting the resistance state of the memory element ME after one second magneto-resistive element 402 which is different from the first magneto-resistive element 401 from among the plural magneto-resistive element 401 and 402 in the memory element ME is rewritten into the first resistance state or the second resistance state as the second resistance value R4.

According to the present embodiment, the data determination of the four resistance states is performed by using the resistance values R1 to R4, and therefore, it is possible to make each interval of the resistance values of the four resistance states narrow. It is thereby possible to relax the design restriction, reduce the data determination error, and perform the proper data determination.

According to the first and second embodiments, in the multi-level MRAM memory device, it is possible to perform the data determination and the reading by securing the read margin by using the little amount of reference memory elements 106a, 106b or without using the reference memory element.

Incidentally, the above-described embodiments are to be considered in all respects as illustrative and no restrictive. Namely, the present invention may be embodied in other specific forms without departing from the spirit or essential characteristics thereof.

It is possible to properly determine a resistance state of a memory element even when variation of resistance values of the memory element is large.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A memory device, comprising:
   a memory element which includes three or more resistance states by using plural magneto-resistive elements each having a first resistance state or a second resistance state; and
   a comparison and determination circuit which compares a resistance value of the memory element before one first magneto-resistive element from among the plural magneto-resistive elements in the memory element is rewritten into the first resistance state and a resistance value of the memory element after the first magneto-resistive element is rewritten into the first resistance state, and determines the resistance state of the memory element in accordance with the comparison result,
   wherein the comparison and determination circuit determines that a resistance state of the first magneto-resistive element in the memory element before the first magneto-resistive element is rewritten into the first resistance state is in the first resistance state when the resistance value of the memory element before the first magneto-resistive element is rewritten into the first resistance state and the resistance value of the memory element after the first magneto-resistive element is rewritten into the first resistance state are the same, and
   determines that a resistance state of the first magneto-resistive element in the memory element before the first magneto-resistive element is rewritten into the first resistance state is in the second resistance state when the resistance value of the memory element before the first magneto-resistive element is rewritten into the first resistance state and the resistance value of the memory element after the first magneto-resistive element is rewritten into the first resistance state are not the same.

2. The memory device according to claim 1,
wherein the plural magneto-resistive elements have the first magneto-resistive element and a second magneto-resistive element,
wherein the comparison and determination circuit compares the resistance value of the memory element after the first magneto-resistive element is rewritten into the first resistance state and a first resistance value, and determines the resistance state of the second magneto-resistive element in the memory element in accordance with the comparison result when the resistance value of the memory element before the first magneto-resistive element is rewritten into the first resistance state and the resistance value of the memory element after the first magneto-resistive element is rewritten into the first resistance state are not the same, and
compares the resistance value of the memory element after the first magneto-resistive element is rewritten into the first resistance state and a second resistance value, and determines the resistance state of the second magneto-resistive element in the memory element in accordance with the comparison result when the resistance value of the memory element before the first magneto-resistive element is rewritten into the first resistance state and the resistance value of the memory element after the first magneto-resistive element is rewritten into the first resistance state are the same.

3. The memory device according to claim 2, further comprising:
a first reference memory element which has the first resistance value by using plural magneto-resistive elements each having the first resistance state or the second resistance state; and
a second reference memory element which has the second resistance value by using the plural magneto-resistive elements each having the first resistance state or the second resistance state,
wherein the comparison and determination circuit performs a comparison by using the first resistance value of the first reference memory element when the resistance value of the memory element before the first magneto-resistive element is rewritten into the first resistance state and the resistance value of the memory element after the first magneto-resistive element is rewritten into the first resistance state are not the same, and
performs the comparison by using the second resistance value of the second reference memory element when the resistance value of the memory element before the first magneto-resistive element is rewritten into the first resistance state and the resistance value of the memory element after the first magneto-resistive element is rewritten into the first resistance state are the same.

4. The memory device according to claim 2,
wherein the comparison and determination circuit performs a comparison while setting a resistance value of the memory element after the second magneto-resistive element in the memory element is rewritten into the first resistance state or the second resistance state as the first resistance value when the resistance value of the memory element before the first magneto-resistive element is rewritten into the first resistance state and the resistance value of the memory element after the first magneto-resistive element is rewritten into the first resistance state are not the same, and performs the comparison while setting a resistance value of the memory element after the second magneto-resistive element in the memory element is rewritten into the first resistance state or the second resistance state as the second resistance value when the resistance value of the memory element before the first magneto-resistive element is rewritten into the first resistance state and the resistance value of the memory element after the first magneto-resistive element is rewritten into the first resistance state are the same.

5. The memory device according to claim 1,
wherein the first magneto-resistive element is written back to the second resistance state when the resistance value of the memory element before the first magneto-resistive element is rewritten into the first resistance state and the resistance value of the memory element after the first magneto-resistive element is rewritten into the first resistance state are not the same.

* * * * *